United States Patent
Iwata

(10) Patent No.: US 10,074,507 B2
(45) Date of Patent: Sep. 11, 2018

(54) ELECTRON BEAM DRAWING APPARATUS AND ELECTRON BEAM DRAWING METHOD

(71) Applicant: NuFlare Technology, Inc., Yokohama-shi (JP)

(72) Inventor: Hideyuki Iwata, Narita (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/646,663

(22) Filed: Jul. 11, 2017

(65) Prior Publication Data
US 2018/0019094 A1    Jan. 18, 2018

(30) Foreign Application Priority Data
Jul. 12, 2016  (JP) .................................. 2016-137692

(51) Int. Cl.
| | |
|---|---|
| *H01J 37/073* | (2006.01) |
| *H01J 37/317* | (2006.01) |
| *H01J 37/20* | (2006.01) |
| *H01J 37/244* | (2006.01) |

(52) U.S. Cl.
CPC ............ *H01J 37/073* (2013.01); *H01J 37/20* (2013.01); *H01J 37/244* (2013.01); *H01J 37/3174* (2013.01); *H01J 2237/24564* (2013.01)

(58) Field of Classification Search
CPC ........ H01J 37/073; H01J 37/20; H01J 37/244; H01J 37/3174
See application file for complete search history.

(56) References Cited

U.S. PATENT DOCUMENTS

| | | | | |
|---|---|---|---|---|
| 3,872,351 A | * | 3/1975 | Smith ................... | H01J 37/073 313/449 |
| 3,936,756 A | * | 2/1976 | Someya ................ | H01J 37/073 315/106 |
| 5,969,355 A | * | 10/1999 | Fujii ..................... | H01J 37/304 250/309 |
| 2013/0200788 A1 | * | 8/2013 | Cho ....................... | H01J 37/073 315/1 |

FOREIGN PATENT DOCUMENTS

| | | |
|---|---|---|
| JP | 2004-86953 | 3/2004 |
| JP | 2012-18790 | 1/2012 |
| JP | 2013-239514 | 11/2013 |

* cited by examiner

*Primary Examiner* — Eliza Osenbaugh-Stewar
(74) *Attorney, Agent, or Firm* — Oblon, McClelland, Maier & Neustadt, L.L.P.

(57) ABSTRACT

In one embodiment, an electron beam drawing apparatus includes an electron gun including a cathode and an anode, a current control circuit controlling a total emission current, a first detector detecting a first emission current from an outer peripheral portion of the cathode, a second detector detecting a second emission current from an central portion of the cathode, and a controller that determines a coefficient, which is a ratio of an emission current from the outer peripheral portion of the cathode to the first emission current. During a period in which a pattern is drawn on the substrate, the controller estimates a value of the second emission current by subtracting a value, which is resulted by multiplying the first emission current by the coefficient, from the total emission current, and controls the current control circuit in a manner of holding the estimated value constant.

14 Claims, 5 Drawing Sheets

ELECTRON BEAM DRAWING APPARATUS AND ELECTRON BEAM DRAWING METHOD

CROSS REFERENCE TO RELATED APPLICATION

This application is based upon and claims benefit of priority from the Japanese Patent Application No. 2016-137692, filed on Jul. 12, 2016, the entire contents of which are incorporated herein by reference.

FIELD

The present invention relates to an electron beam drawing apparatus and an electron beam drawing method.

BACKGROUND

As the integration density of LSIs increases, the circuit line widths of semiconductor devices become narrower year by year. Forming a desired circuit pattern on a semiconductor device involves using a technique in which a high-precision original pattern (also referred to as a mask, or particularly referred to as a reticle if it is used in a stepper or scanner) formed on a quartz member is transferred in a reduced form onto a wafer using a step-and-repeat exposure system. The high-precision original pattern is written by an electron beam writing apparatus using a so-called electron beam lithography technique.

A thermionic-emission electron gun provided with a cathode serving as a heater is employed as an electron gun of an electron beam drawing apparatus. In such an electron gun, electrons are emitted by heating the cathode. The emitted electrons are accelerated with an acceleration voltage and are delivered in the form of an electron beam, which is applied to a sample. In an electron beam drawing apparatus of related art, a current of the electrons emitted from the cathode (i.e., an emission current) is controlled to be held constant.

A variation in the emission current is different depending on a place. For instance, the variation in the emission current from a central portion of the cathode is often different from that in the emission current from an outer peripheral portion of the cathode. Because the electron beam applied to the sample is made up of electrons mainly emitted from the central portion of the cathode, it is preferable that the emission current from the central portion of the cathode is kept constant.

In the past, however, only a total emission current, i.e., the sum of the emission current from the central portion of the cathode and the emission current from the outer peripheral portion of the cathode, is measured, and the total emission current is controlled to be held constant. Thus, the total emission current is controlled to be held at a predetermined value in consideration of that, when the emission current from an outer peripheral portion of the cathode varies, the total emission current also varies in spite of no variation in the emission current from the central portion of the cathode. Such control may vary the emission current from the central portion of the cathode, which has not been varied, and may rather adversely affect drawing accuracy.

DETAILED DESCRIPTION

According to one embodiment, an electron beam drawing apparatus includes an electron gun including a cathode that emits an electron beam, an anode, and a Wehnelt arranged between the cathode and the anode, a power supply circuit including a high-voltage power supply that applies an acceleration voltage between the cathode and the anode, and a current control circuit that controls a total emission current, a first detector that detects a first emission current from an outer peripheral portion of the cathode, the first emission current being part of the total emission current, a stage on which a substrate as a drawing target is placed, a second detector that detects a second emission current from an central portion of the cathode, the second emission current being part of the total emission current, and a controller that determines a coefficient, which is a ratio of an emission current from the outer peripheral portion of the cathode to the first emission current, by employing the total emission current, the first emission current, and the second emission current. During a period in which a pattern is drawn on the substrate, the controller estimates a value of the second emission current by subtracting a value, which is resulted by multiplying the first emission current by the coefficient, from the total emission current, and controls the current control circuit in a manner of holding the estimated value constant.

An embodiment of the present invention will be described below with reference to the drawings.

Figure 1:
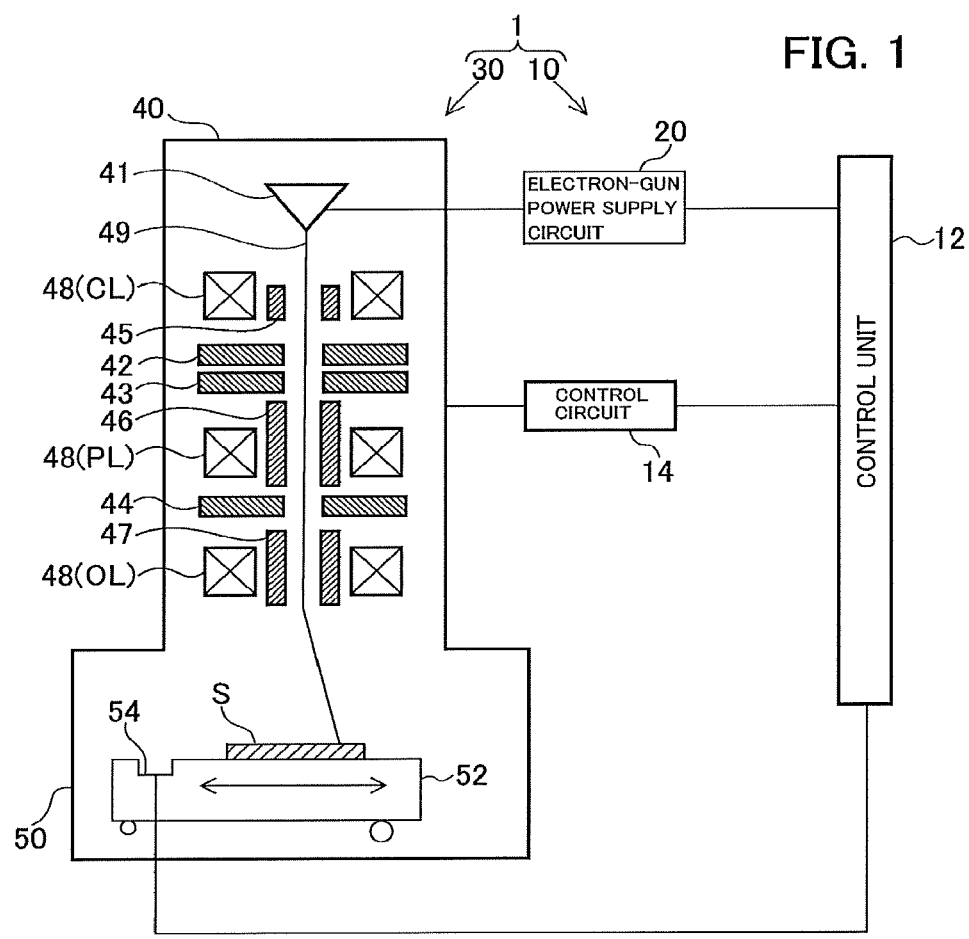
FIG. 1 is a schematic view of an electron beam drawing apparatus according to an embodiment of the present invention.
Figure 2:
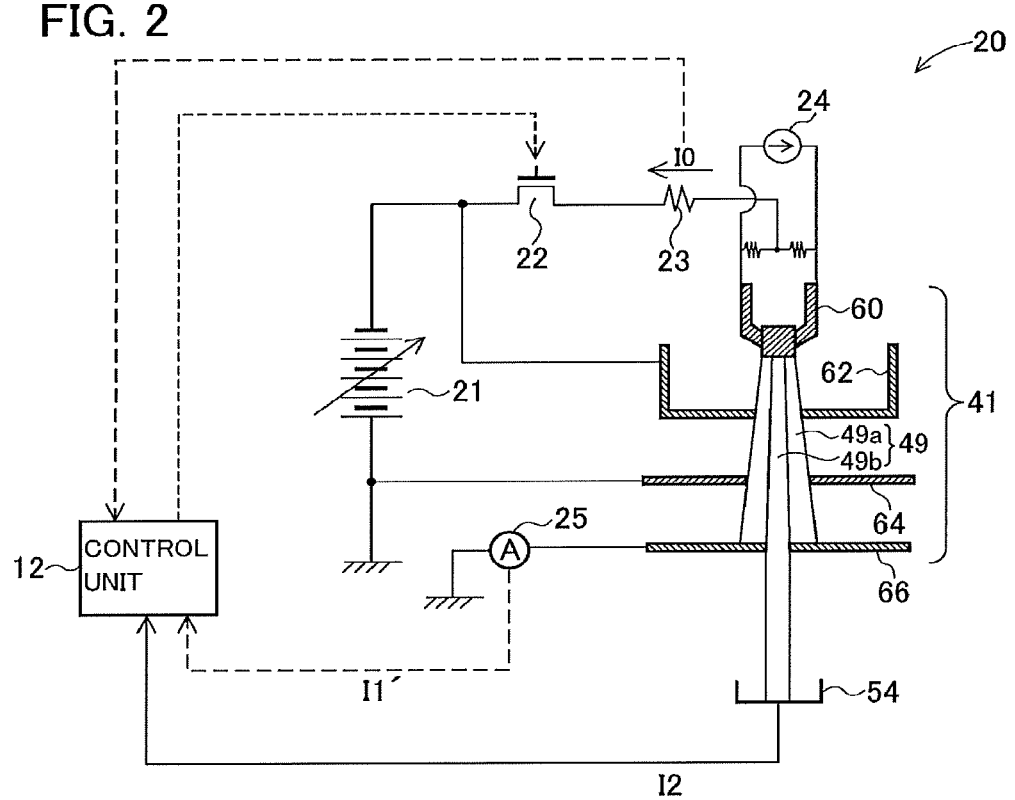
FIG. 2 is a schematic view illustrating a configuration of an electron gun according to the embodiment.
Figure 3:
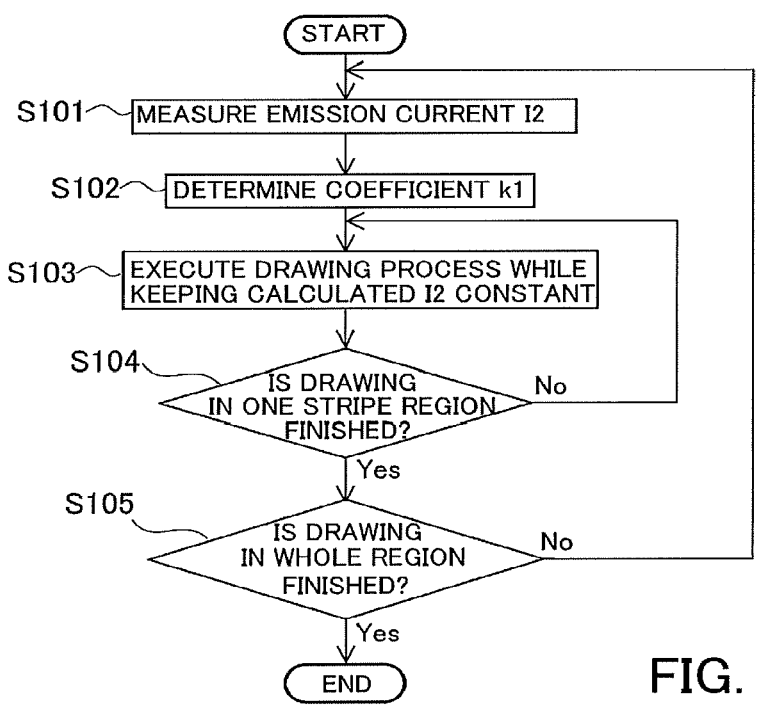
FIG. 3 is a flowchart referenced to explain an electron beam drawing method according to the embodiment.

FIG. 1 schematically illustrates a configuration of an electron beam drawing apparatus according to the embodiment. FIG. 2 schematically illustrates a configuration of an electron gun 41 and an electron-gun power supply circuit 20. FIG. 3 is a flowchart referenced to explain an electron beam drawing method according to the embodiment.

A drawing apparatus 1 illustrated in FIG. 1 includes a drawing unit 30 that applies an electron beam to a substrate S, i.e., a drawing target, thereby drawing a desired pattern, and a controller 10 that controls an operation of the drawing unit 30.

The drawing unit 30 includes an electron beam column 40 and a drawing chamber 50. The electron gun 41, a blanking aperture 42, a first shaping aperture 43, a second shaping aperture 44, a blanking deflector 45, a shaping deflector 46, an objective deflector 47, and lenses 48 (including an illumination lens CL, a projection lens PL, and an objective lens OL) are arranged in the column 40.

An XY stage 52 is movably arranged inside the drawing chamber 50. The substrate S, i.e., the drawing target, is placed on the XY stage 52. The substrate S is, for example, an exposure mask or a mask blank that is used to manufacture a semiconductor device, or a semiconductor substrate (such as silicon wafer) on which a semiconductor device is manufactured. Furthermore, a Faraday cup 54 is arranged on the XY stage 52 at a position different from the position where the substrate S is placed.

An electron beam 49 emitted from the electron gun 41 illuminates, through the illumination lens 48 (CL), the entirety of the first shaping aperture 43 that has a rectangular hole. Here, the electron beam 49 is first shaped into a rectangular form. The electron beam being in a first shaping aperture image and having passed through the first shaping aperture 43 is then projected onto the second shaping aperture 44 by the projection lens 48 (PL). A position of the first aperture image on the second shaping aperture 44 is controlled by the shaping deflector 46 such that a beam shape and size can be changed.

The electron beam having passed through the second shaping aperture 44 and being in a second aperture image is focused by the objective lens 48 (OL), deflected by the objective deflector 47, and applied to a desired position of the substrate S on the XY stage 52 or to the Faraday cup 54.

The electron beam 49 emitted from the electron gun 41 is controlled by the blanking deflector 45 such that the beam passes through the blanking aperture 42 in a beam-on state, and that the beam is deflected to be entirely blocked by the blanking aperture 42 in a beam-off state. The electron beam having passed through the blanking aperture 42 during a period from timing of beam-on from the beam-off state to timing of subsequent beam-off provides one shot of the electron beam. An irradiation dose per shot of the electron beam applied to a resist film on the surface of the substrate S is adjusted depending on an irradiation time of each shot.

The controller 10 includes a control computer 12, a control circuit 14, and an electron-gun power supply circuit 20.

The control computer 12 executes multiple stages of data conversion processing on drawing data to generate shot data specific to the apparatus, and outputs the shot data to the control circuit 14. An irradiation position, a beam shape and size, an irradiation dose, etc. per shot are defined as the shot data.

The control circuit 14 determines an irradiation time t by dividing the irradiation dose defined in the shot data by a current density. Moreover, the control circuit 14 applies a deflection voltage to the blanking deflector 45 on the basis of the irradiation time t when the corresponding shot is performed.

The control circuit 14 applies a deflection voltage to the shaping deflector 46 on the basis of the beam shape and size, which are defined in the shot data. Furthermore, the control circuit 14 applies a deflection voltage to the objective deflector 47 on the basis of the position of the XY stage 52 and the irradiation position defined in the shot data.

The control computer 12 controls an operation of the electron-gun power supply circuit 20 that is connected to the electron gun 41.

The electron gun 41 is a thermal electron gun (thermal emission electron gun) including, as illustrated in FIG. 2, a cathode 60 (electron beam source), a Whenelt 62 (Wehnelt electrode), an anode 64, and a detector 66. A lanthanum hexaboride (LaB$_6$) crystal, for example, can be used as the cathode 60.

The Whenelt 62 is arranged between the cathode 60 and the anode 64, and it has an opening through which the electron beam 49 emitted from the cathode 60 passes. The anode 64 is grounded and its potential is set to a ground potential.

The detector 66 is an aperture member having an opening through which an electron beam 49b from a central portion of the cathode 60 passes. Part of an electron beam 49a from an outer peripheral portion of the cathode 60 is blocked by the detector 66 (a sensor). A later-described ammeter 25 is disposed between the detector 66 and the ground to measure a current I1'. The current I1' is part of an emission current I1 from the outer peripheral portion of the cathode.

Upon irradiation of the Faraday cup 54 with the electron beam 49b from the central portion of the cathode 60 after having passed through the detector 66, an emission current I2 from the central portion of the cathode is measured.

The electron-gun power supply circuit 20 is connected to the electron gun 41. The electron-gun power supply circuit 20 includes an acceleration voltage power supply 21, a current control circuit 22, a detection resistance 23, a filament power supply circuit 24, and the ammeter 25.

A negative electrode (−) side of the acceleration voltage power supply 21 is connected to the cathode 60 via both the current control circuit 22 and the detection resistance 23. A positive electrode (+) side of the acceleration voltage power supply 21 is connected to the anode 64 and is grounded (connected to the ground). In addition, the negative electrode (−) of the acceleration voltage power supply 21 is branched and connected to the Wehnelt 62.

The current control circuit 22 is constituted by an FET (field effect transistor), for example. The detection resistance 23 is disposed between the current control circuit 22 and the cathode 60. A total emission current I0 is detected from a potential difference between opposite ends of the detection resistance 23. Here, the total emission current I0 is the sum of the emission current I1 from the outer peripheral portion of the cathode and the emission current I2 from the central portion of the cathode.

A portion of the cathode 60 on the side opposite to an electron emission surface is covered with a heater member (not illustrated). The filament power supply circuit 24 is connected to the heater member of the cathode 60. The acceleration voltage power supply (high-voltage power supply) 21 applies an acceleration voltage between the cathode 60 and the anode 64. The current control circuit 22 applies a bias voltage to the Wehnelt 62. The filament power supply circuit 24 supplies filament power to the cathode 60 through the heater member and heats the cathode 60.

When the cathode 60 is heated in a state where the negative acceleration voltage is applied to the cathode 60 from the acceleration voltage power supply 21 and a negative bias voltage is applied to the Whenelt 62 from the current control circuit 22, electrons are emitted from the cathode 60, and the emitted electrons (group of electrons) are accelerated to advance, in the form of the electron beam 49, toward the anode 64. After passing through the openings formed in both the anode 64 and the detector 66, the electron beam 49 is emitted from the electron gun 41.

In this embodiment, control is executed in a manner of holding constant the emission current I2 from the central portion of the cathode. However, during a period in which a pattern is drawn on the substrate S, the total emission current I0 and the emission current I1' can be measured, whereas the emission current I2 cannot be measured by the Faraday cup 54.

In this embodiment, taking the above point into consideration, the emission current I2 is measured by the Faraday cup 54 before the start of drawing or at predetermined timing during the drawing (step S101 in FIG. 3). Then, the control computer 12 determines a coefficient k1 from the following mathematical formula 1 by employing the total emission current I0 and the emission current I1' (step S102).

$$k1=(I0-I2)/I1' \qquad \text{Formula 1:}$$

As described above, the total emission current I0 is the sum of the emission current I1 from the outer peripheral portion of the cathode and the emission current I2 from the central portion of the cathode. The coefficient k1 determined from the mathematical formula 1 is a ratio of the emission current I1 from the outer peripheral portion of the cathode to the emission current I1'. In other words, the coefficient k1 is a coefficient that is used to calculate (estimate) the emission current I1 from the outer peripheral portion of the cathode on the basis of the emission current I1' measured by the ammeter 25.

During the period in which the pattern is drawn on the substrate S, the total emission current I0 and the emission current I1' are measured, and the emission current I2 is calculated (estimated) by the control computer 12 from the following mathematical formula 2.

$$I2=I0-k1 \times I1'\qquad\text{Formula 2:}$$

The control computer 12 executes a drawing process while controlling the current control circuit 22 such that the emission current I2 calculated from the mathematical formula 2 is held constant (step S103). The control computer 12 controls, for example, a gate voltage of the FET that constitutes the current control circuit 22.

In the drawing performed on the substrate S, a drawing region of the substrate S is virtually divided into a plurality of stripe regions each having a strip-like form with a predetermined width, and the drawing is progressed successively in units of the stripe region. For instance, it is preferable that, after the drawing in one stripe region, the emission current I2 is measured by the Faraday cup 54 before starting the drawing in the next stripe region and the coefficient k1 is updated ("Yes" in step S104 and "No" in step S105). During the drawing in the next stripe region, the emission current I2 is calculated using the updated coefficient k1, and the control is executed in a manner of holding the emission current I2 constant.

In some cases, the emission current I1 from the outer peripheral portion of the cathode may vary in spite of no variation in the emission current I2 from the central portion of the cathode. In those cases, control of holding the total emission current I0 constant may rather vary the emission current I2 that has been held at a preferable value, and may adversely affect drawing accuracy.

On the other hand, in this embodiment, the emission current I2 from the central portion of the cathode is estimated (calculated), and the estimated value is controlled to be held constant. Stated in another way, the current control (current adjustment) is not executed when the emission current I2 from the central portion of the cathode does not vary in spite of a variation in the total emission current I0. Accordingly, behaviors of the electron beam 49b emitted from the central portion of the cathode and applied to the substrate S are stabilized, and the drawing accuracy can be improved.

Figure 4:
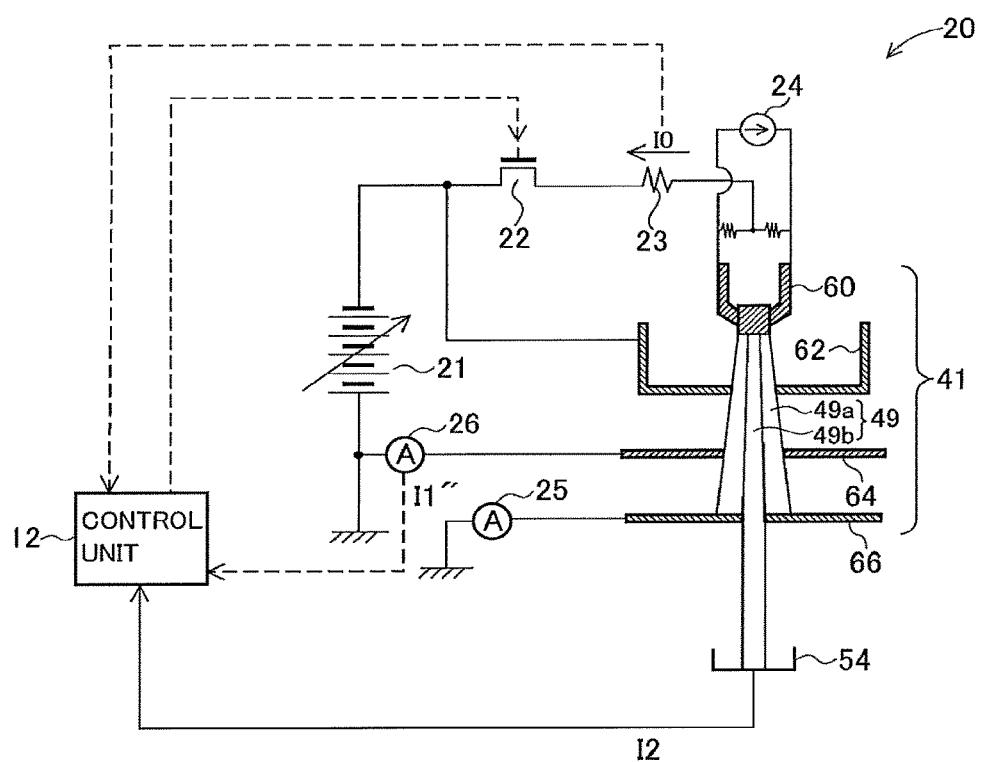
FIG. 4 is a schematic view illustrating a configuration of an electron gun according to another embodiment.

While the above embodiment has been described in connection with the example in which the emission current I1 from the outer peripheral portion of the cathode is estimated from the emission current I1' measured by the ammeter 25 that is connected to the detector 66, an ammeter 26 may be disposed between the anode 64 and the ground, as illustrated in FIG. 4, to measure a current I1". In such a case, the control computer 12 determines a coefficient k2 from the following mathematical formula 3.

$$k2=(I0-I2)/I1''\qquad\text{Formula 3:}$$

During the period in which the pattern is drawn on the substrate S, the total emission current I0 and the emission currents I1" are measured. The control computer 12 calculates (estimates) the emission current I2 from the following mathematical formula 4, and executes the control in a manner of holding the calculated I2 constant.

$$I2=I0-k2 \times I1''\qquad\text{Formula 4:}$$

The anode 64 is positioned above the detector 66, i.e., nearer to the cathode 60. Therefore, the emission current I1 from the outer peripheral portion of the cathode can be calculated from the current I1" and the coefficient k2 with higher accuracy.

Figure 5:
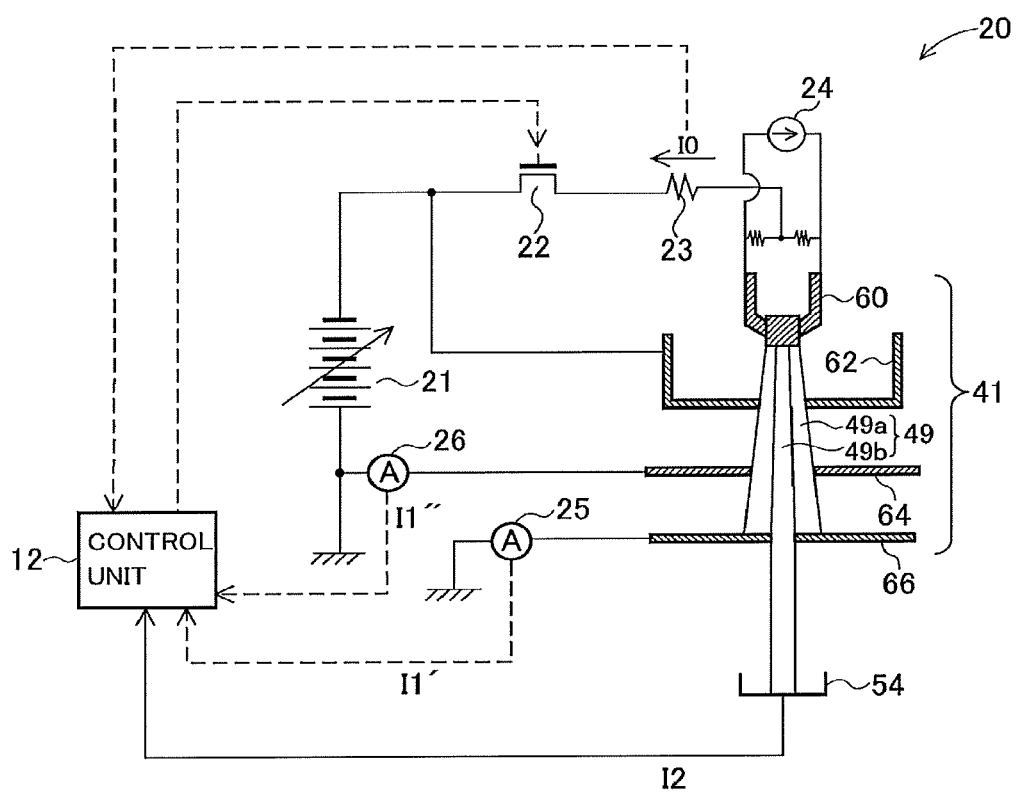
FIG. 5 is a schematic view illustrating a configuration of an electron gun according to still another embodiment.

As illustrated in FIG. 5, the emission current I1 from the outer peripheral portion of the cathode may be estimated from both the emission current I1' measured by the ammeter 25 and the emission current I1" measured by the ammeter 26. In that case, the control computer 12 determines a coefficient k3 from the following mathematical formula 5.

$$k3=(I0-I2)/(I1'+I1'')\qquad\text{Formula 5:}$$

During the period in which the pattern is drawn on the substrate S, the total emission current I0 and the emission currents I1' and I1" are measured. The control computer 12 calculates (estimates) the emission current I2 from the following mathematical formula 6, and executes the control in a manner of holding the calculated I2 constant.

$$I2=I0-k3 \times (I1'+I1'')\qquad\text{Formula 6:}$$

Since the current values measured from both the anode 64 and the detector 66 are used, the emission current I1 from the outer peripheral portion of the cathode can be calculated with even higher accuracy.

The detector 66 may be disposed in two upper and lower stages, and the emission current I2 from the central portion of the cathode may be estimated by calculating the emission current I1 from the outer peripheral portion of the cathode on the basis of respective current values that have been measured by the detectors 66 in the individual stages. It is also possible to estimate the emission current I2 from the central portion of the cathode by employing only the current value measured from the anode 64.

While the above embodiment has been described in connection with a single-beam drawing apparatus, the present invention may be applied to a multi-beam drawing apparatus as well. The multi-beam drawing apparatus includes an aperture member having a plurality of openings formed therein, and the electron beam emitted from the electron gun 41 passes through the aperture member, whereby multiple beams are formed. In the multi-beam drawing apparatus, because a current amount of one beam is small, the current amount is preferably measured by applying a plurality of beams together to the Faraday cup 54. Respective current amounts of all of the multiple beams may be measured, and a total value of those current amounts may be used as I2. As an alternative, a total value of respective current amounts of a predetermined number of beams among the multiple beams may be multiplied by a predetermined value, and a resulting value may be used as I2.

In the above embodiment, a configuration that uses an electron beam as an example of a charged-particle beam is described. Note that a charged-particle beam is not limited to an electron beam and may be another charged-particle beam, such as an ion beam.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electron beam drawing apparatus comprising:
an electron gun including a cathode that emits an electron beam, an anode, and a Wehnelt arranged between the cathode and the anode;
a power supply circuit including a high-voltage power supply that applies an acceleration voltage between the cathode and the anode, and a current control circuit that controls a total emission current;
a first detector that detects a first emission current from an outer peripheral portion of the cathode, the first emission current being part of the total emission current;
a stage on which a substrate as a drawing target is placed;
a second detector that detects a second emission current from an central portion of the cathode, the second emission current being part of the total emission current; and
a controller that determines a coefficient, which is a ratio of an emission current from the outer peripheral portion of the cathode to the first emission current, by employing the total emission current, the first emission current, and the second emission current,
wherein, during a period in which a pattern is drawn on the substrate, the controller estimates a value of the second emission current by subtracting a value, which is resulted by multiplying the first emission current by the coefficient, from the total emission current, and controls the current control circuit in a manner of holding the estimated value constant.

2. The apparatus according to claim 1, wherein a drawing region on the substrate is virtually divided into a plurality of stripe regions, and the pattern is drawn by each of the stripe regions,
the second detector detects the second emission current in a period after the drawing in a first stripe region and before starting the drawing in a second stripe region that is a next stripe region in a drawing sequence, and
the controller updates the coefficient by employing the detected second emission current, and estimates a value of the second emission current by employing the updated coefficient during the drawing in the second stripe region.

3. The apparatus according to claim 1, wherein the first detector is disposed in association with the anode.

4. The apparatus according to claim 1, wherein the first detector is disposed in association with a sensor arranged under the anode.

5. The apparatus according to claim 1, wherein the first detector is disposed in association with each of the anode and a sensor arranged under the anode, and a total of currents detected from both the anode and the sensor is used as the first emission current.

6. The apparatus according to claim 1, wherein the second detector is disposed at a position different from a region of the stage where the substrate is placed.

7. The apparatus according to claim 1, further comprising an aperture member having a plurality of openings formed therein, the electron beam emitted from the electron gun passing through the openings to form multiple beams,
wherein the second detector detects the second emission current on the basis of respective current amounts of all of the multiple beams or a predetermined number of beams among the multiple beams.

8. An electron beam drawing method comprising:
controlling a total emission current between a cathode and an anode of an electron gun, and emitting an electron beam from the cathode;
detecting a first emission current from an outer peripheral portion of the cathode, the first emission current being part of the total emission current;
detecting a second emission current from an central portion of the cathode, the second emission current being part of the total emission current; and
determining a coefficient, which is a ratio of the emission current from the outer peripheral portion of the cathode to the first emission current, by employing the total emission current, the first emission current, and the second emission current,
wherein, during a period in which a pattern is drawn on a substrate with use of the electron beam, a value of the second emission current is estimated by subtracting a value, which is resulted by multiplying the first emission current by the coefficient, from the total emission current, and the total emission current is controlled in a manner of holding the estimated value constant.

9. The method according to claim 8, wherein a drawing region on the substrate is virtually divided into a plurality of stripe regions, and drawing is performed in units of the stripe region,
the second emission current is detected in a period after the drawing in a first stripe region and before starting the drawing in a second stripe region that is a next stripe region in a drawing sequence, and
the coefficient is updated by employing the detected second emission current, and a value of the second emission current is estimated by employing the updated coefficient during the drawing in the second stripe region.

10. The method according to claim 8, wherein the first emission current is detected using a first detector disposed in association with the anode.

11. The method according to claim 8, wherein the first emission current is detected using a first detector disposed in association with a sensor that is arranged under the anode.

12. The method according to claim 8, wherein the first emission current is given as a total of currents detected by the first detectors that are disposed respectively in association with the anode and the sensor arranged under the anode.

13. The method according to claim 8, wherein the second emission current is detected using a second detector that is disposed at a position different from a region of a stage where the substrate is placed.

14. The method according to claim 13, further comprising causing the electron beam to pass through a plurality of openings formed in an aperture member, and forming multiple beams,
wherein the second detector detects the second emission current on the basis of respective current amounts of all of the multiple beams or a predetermined number of beams among the multiple beams.

* * * * *